(12) United States Patent  
Doris et al.

(10) Patent No.: US 8,187,961 B2  
(45) Date of Patent: May 29, 2012

(54) THRESHOLD ADJUSTMENT FOR HIGH-K GATE DIELECTRIC CMOS

(75) Inventors: Bruce B. Doris, Brewster, NY (US); Eduard Albert Cartier, New York, NY (US); Vijay Narayanan, New York, NY (US); Vamsi Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 401 days.

(21) Appl. No.: 12/535,554

(22) Filed: Aug. 4, 2009

(65) Prior Publication Data

US 2009/0291553 A1    Nov. 26, 2009

Related U.S. Application Data

(62) Division of application No. 11/743,101, filed on May 1, 2007, now abandoned.

(51) Int. Cl.
*H01L 21/3205* (2006.01)
*H01L 21/4763* (2006.01)

(52) U.S. Cl. ........ 438/585; 438/151; 438/216; 438/591; 438/981; 257/E21.584; 257/E21.626; 257/E21.639

(58) Field of Classification Search ................. 438/981, 438/151, 591, 216, 585; 257/E21.584, E21.626, 257/E21.639
See application file for complete search history.

(56) References Cited

U.S. PATENT DOCUMENTS

| | | | | |
|---|---|---|---|---|
| 6,165,826 A | 12/2000 | Chau | | 438/231 |
| 6,605,501 B1 | 8/2003 | Ang | | 438/212 |
| 2002/0000633 A1 | 1/2002 | Miyashita | | 257/500 |
| 2002/0052086 A1 | 5/2002 | Maeda | | 438/283 |
| 2003/0089951 A1 * | 5/2003 | Ker et al. | | 257/355 |
| 2003/0183901 A1 | 10/2003 | Kanda | | 257/510 |
| 2004/0188769 A1 | 9/2004 | Tsuno | | 257/371 |
| 2006/0017098 A1 * | 1/2006 | Doczy et al. | | 257/330 |
| 2006/0043497 A1 | 3/2006 | Kimizuka | | 257/388 |
| 2006/0121668 A1 | 6/2006 | Metz | | 438/216 |
| 2006/0246740 A1 | 11/2006 | Cartier | | 438/778 |
| 2007/0148838 A1 | 6/2007 | Doris | | 438/197 |
| 2007/0152276 A1 | 7/2007 | Arnold | | 257/369 |

OTHER PUBLICATIONS

E. Cartier et al., "Role of Oxygen Vacancies in $V_{fb}/V_t$ Stability of pFET Metals on $HfO_2$" Symp. VLSI Tech. (2005) 230-231.
V. Narayanan, et al., "Band-Edge High-Performance High-/Metal Gate n-MOSFETs using Cap Layers Containing Group IIA and IIIB Elements with Gate-First Processing for 45 nm and Beyond", Symp. VLSI Tech. (2006) 224-225.

* cited by examiner

*Primary Examiner* — Matthew E Warren
*Assistant Examiner* — David Chen
(74) *Attorney, Agent, or Firm* — George Sai-Halasz; Louis J. Percello

(57) ABSTRACT

A CMOS structure is disclosed in which a first type FET has an extremely thin oxide liner. This thin liner is capable of preventing oxygen from reaching the high-k dielectric gate insulator of the first type FET. A second type FET device of the CMOS structure has a thicker oxide liner. As a result, an oxygen exposure is capable to shift the threshold voltage of the second type of FET, without affecting the threshold value of the first type FET. The disclosure also teaches methods for producing the CMOS structure in which differing type of FET devices have differing thickness liners, and the threshold values of the differing type of FET devices is set independently from one another.

9 Claims, 4 Drawing Sheets

THRESHOLD ADJUSTMENT FOR HIGH-K GATE DIELECTRIC CMOS

CROSS REFERENCE TO A RELATED APPLICATION

This application is a Division of application Ser. No. 11/743,101, filed May 1, 2007, which is incorporated herein by reference in its entirety.

FIELD OF THE INVENTION

The present invention relates to electronic devices. In particular, it relates to CMOS structures having high-k containing gate dielectrics, and to ways to adjust the threshold voltage for the two type of devices independently from one another.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy. The devices in the embodiments of the present disclosure are typically part of the art of single crystal Si based material device technology.

There is a great difficulty in maintaining performance improvements in devices of deeply sub micron generations. Therefore, methods for improving performance without scaling down have become of interest. There is a promising avenue toward higher gate dielectric capacitance without having to make the gate dielectric actually thinner. This approach involves the use of so called high-k materials. The dielectric constant of such materials is significantly higher than that of $SiO_2$, which is about 3.9. A high-k material may physically be significantly thicker than oxide, and still have a lower equivalent oxide thickness (EOT) value. The EOT, a concept known in the art, refers to the thickness of such an $SiO_2$ layer which has the same capacitance per unit area as the insulator layer in question. In today state of the art FET devices, one is aiming at an EOT of below 2 nm, and preferably below 1 nm.

Device performance is also enhanced by the use of metal gates. The depletion region in the poly-Si next to the gate insulator can become an obstacle in increasing gate-to-channel capacitance, or equivalently to decrease the EOT. The solution is to use a metal gate. Metal gates also assure good conductivity along the width direction of the gates, reducing the danger of possible RC delays of the gate.

High performance small FET devices are also in need of precise threshold voltage control. As operating voltage decreases, to 2V and below, threshold voltages also have to decrease, and threshold variation becomes less tolerable. Every new element, such as a different gate dielectric, or a different gate material, influences the threshold voltage. Sometimes such influences are detrimental for achieving the desired threshold voltage values. Any technique which can affect the threshold voltage, without other effects on the devices is a useful one. One such technique, available when high-k dielectrics are present in a gate insulator, is the exposure of the gate dielectric to oxygen. A high-k material upon exposure to oxygen lowers the PFET threshold and increases the NFET threshold. Such an effect has been known and used before. Unfortunately, shifting the threshold of both PFET and NFET devices simultaneously, may not easily lead to threshold values in an acceptable tight range for CMOS circuits. There is great need for a structure and a technique in which the threshold of one type of device can be independently adjusted without altering the threshold of the other type of device. To date, such structure and technique has not been taught.

SUMMARY OF THE INVENTION

In view of the discussed difficulties, embodiments of the present invention discloses a CMOS structure, which contains at least one first type FET device and at least one second type FET device. The first type FET contains a first gate insulator which has a first high-k dielectric. The first type FET also has a first liner composed of oxide and having thickness between about 0.2 nm and 1.2 nm. The second type FET contains a second gate insulator which has a second high-k dielectric. The second type FET also has a second liner composed of oxide and with a thickness at least three times larger than the thickness of the first liner. As a result, when the structure is exposed to oxygen, oxygen is capable to reach the second high-k dielectric through the second liner, and shift the threshold voltage of the second type of FET, without affecting the threshold of the first type FET.

The invention further discloses a method for producing a CMOS structure. The method includes the fabrication of a first type FET device with a first gate insulator containing a first high-k dielectric, and fabricating a temporary liner composed of oxide. Fabricating a second type FET device having a second gate insulator containing a second high-k dielectric, and fabricating a second liner also composed of oxide. The method further includes removing completely the temporary liner by etching. In the place of the removed temporary liner a chemical oxide liner is formed with thickness of between about 0.2 nm and 1.2 nm, which is so selected to be at least three times smaller than the thickness of the second liner. The method further includes exposing the first type FET device and the second type FET device to oxygen. Oxygen penetrates through the second liner reaching the second high-k dielectric of the second gate insulator, and causes a predetermined shift in the threshold voltage of the second type FET device, while, due to the extremely small thickness of the first liner, oxygen is not penetrating to the first high-k dielectric of the first gate insulator, and the threshold voltage of the first type FET device remains unchanged.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
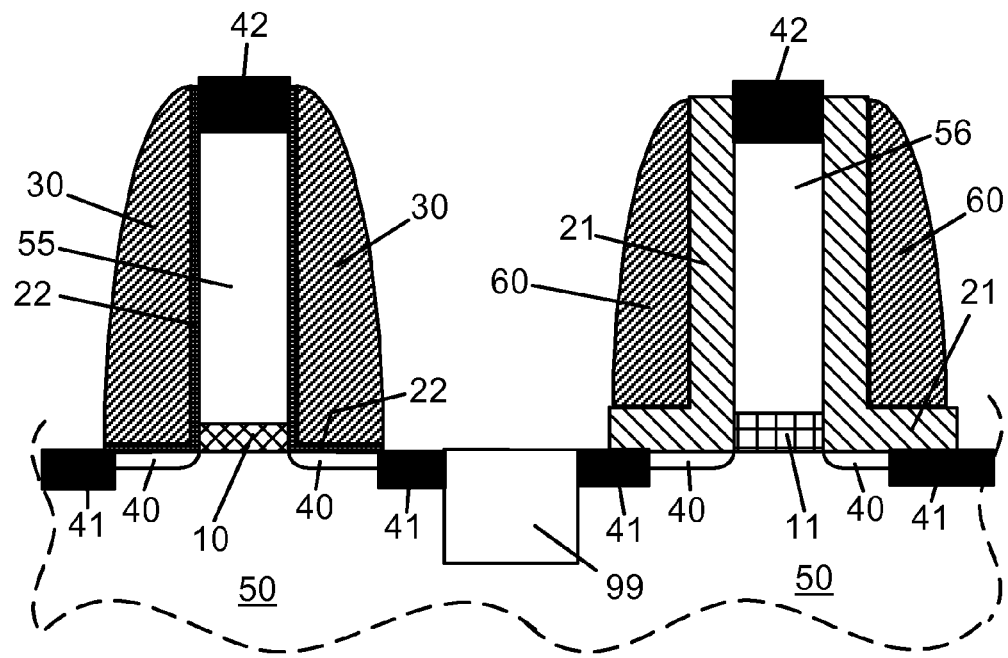
FIG. 1 shows a schematic cross section of a CMOS structure with one type device having a chemically deposited oxide liner, according to an embodiment of the present invention.

It is understood that Field Effect Transistor-s (FET) are well known in the electronic arts. Standard components of a FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator. There are two type of FET devices: a hole conduction type, called PFET, and an electron conduction type, called NFET. Often PFET and NFET devices are wired into CMOS circuits. A CMOS circuit contains at least one PFET and at least one NFET device. In manufacturing, or processing, when NFET and PFET devices are fabricated together on the same chip, one is dealing with CMOS processing and the fabrication of CMOS structures. In FET operation, an electrical attribute is the threshold voltage. When the voltage between the gate and the source exceeds the threshold voltage, the devices are capable to carry current between the source and the drain. In general, NFET threshold voltages are positive, and PFET threshold voltages are negative. However, it is customary in the art to refer to the thresholds of both type of devices only by their absolute values. For FET devices the threshold is an inherent attribute.

As FET devices are scaled to smaller size, typically with gate lengths less than 100 nm, the traditional way of setting threshold voltage, namely by adjusting body and channel doping, looses effectiveness. The effective workfunction of the gate material, and gate insulator properties are becoming important factors in determining the threshold of small FETs, which FETs usually operate in a range of less than about 2V. The direction of performance driven technology is toward the use of metallic gates and high-k dielectrics for gate insulator. However, the optimal combination of a particular metal gate and a particular high-k dielectric in the gate insulator, might not lead to optimal threshold values for both NFET and PFET devices from a performance, or processing point of view.

It is known that exposing a gate dielectric which comprises a high-k material to oxygen, can result in shifting device thresholds in a direction which is the same as if one moved the gate workfunction toward a $p^+$ silicon workfunction. This results in lowering the PFET threshold, namely, making it a smaller negative voltage, and raising the NFET threshold, namely making it a larger positive voltage. It is preferable to carry out such an oxygen exposure at relatively low temperatures, and it is also preferable that no high temperature processing should occur afterwards. Accordingly, such a threshold shifting operation should occur late in the device fabrication, typically after the source and the drain have been activated. This requirement means that one has to expose the high-k material in the gate dielectric at a point in the fabrication process when substantially most of the processing has already been carried out, for instance, the gate and gate sidewalls are all in place, and the gate insulator is shielded under several layers of various materials. However, there may be a path for the oxygen to reach from the environs to the gate insulator. This path is inside a so called liner. The use of liners, thin insulating layers which are deposited conformally essentially over all of the structures, in particular over the gates and the source/drain regions, is standard practice in CMOS processing. For adjusting the threshold of devices the property of interest is that the liner should be penetrable by oxygen. Threshold shifts due to oxygen diffusion through liners, have already been reported: "2005 Symposium on VLSI Technology Digest of Technical Papers, Pg. 230, by E. Cartier".

It would be preferable, if the thresholds of the different types of devices could be adjusted individually, meaning one would desire to use threshold tuning techniques, such as the oxygen exposure, in a manner that the threshold of one type device becomes adjusted, without affecting the threshold of the other type of device. Embodiments of the present invention teach such a selective adjusting of a device threshold by having a liner allowing oxygen diffusion for one type of FET, while modifying the liner of the other type of FET in such a manner that it becomes substantially impenetrable to oxygen.

FIG. 1 shows a schematic cross section of a CMOS structure with one type device having a chemically deposited oxide liner, according to an embodiment of the present invention. At this stage of the fabrication the CMOS structure is adapted for being exposed to a low temperature oxidation, which may result in a threshold shift for one of the FETs. The threshold shift is such that depending on which type of device allows oxygen diffusion to the gate insulator, the threshold of the PFET would be lowered, while the threshold of the NFET would be raised.

FIG. 1 depicts two devices, an NFET and a PFET, of the at least one NFET and PFET device that make up a CMOS structure. In FIG. 1 it is not specified which of the two devices is an NFET and which one is a PFET. Embodiments of the invention cover both cases, as to which type of device, NFET or PFET, is the one whose threshold is adjusted by exposure to oxygen. Accordingly, a first type and a second type FET device will be discussed, with the understanding that if the first type is an NFET than the second type is a PFET, and the other way around, if the first type is a PFET than the second type is an NFET.

It is understood that in addition to the elements of the embodiments of the invention the figures show several other elements, since they are standard components of FET devices, as known in the art. The device bodies 50 are typically of a single crystal Si based material. In a representative embodiment of the invention the Si based material bodies 50 are essentially single crystal Si. In, exemplary embodiments of the invention the device bodies 50 are part of a substrate. The substrate may be any type known in the electronic art, such as bulk, or semiconductor on insulator (SOI), fully depleted, or partially depleted, FIN type, or any other kind. Also, substrates may have various wells of various conductivity types, in various nested positioning enclosing device bodies. The figure shows what typically may be only a small fraction of an electronic chip, for instance a processor, as indicated by the wavy dashed line boundaries. The devices may be isolated from one another by any method known in the art. The figure shows a shallow trench 99 isolation scheme, as this is a typical advanced isolation technique available in the art. The devices have source/drain extensions 40, and silicided sources and drains 41, as well as have silicide 42 on the gates 55, 56. As one skilled in the art would know, these elements all have their individual characteristics. Accordingly, when common indicators numbers are used in the figures of the present disclosure, it is because from the point of view of embodiments of the present invention the individual characteristics of such elements are not important. FIG. 1 shows that the sources and drains of the devices have already been fabricated. In CMOS processing typically the highest temperature-budgets, meaning temperature and time exposure combinations, are reached during source/drain fabrication. For the CMOS structure of FIG. 1, since the sources and drains have already been fabricated, such high temperature fabrication steps have already been performed, and the structure will not have to be exposed to further high temperature treatment. For the intentions of embodiments of the present invention, exposure to a high temperature-budget means a comparable heat treatment as one used in source/drain fabrication.

The devices have standard sidewall spacers 30, 60. For the embodiments of the present invention the spacer material is significant only to the extent that it is preferably impenetrable to oxygen. The typical material used in the art for such spacers is nitride (SiN), which is an exemplary oxygen blocking material. Typically the spacer of the first type FET device 30 and the spacer of the second type FET device 60 are fabricated during the same processing steps, and are the same material. However, since the gate stacks 55, 56 may be different from one another, and the liners 22, 21 differ from one another on purpose, the spacers 30, 60 of the two type of devices are likely to be of different in their detailed shape. The gate 55 of the first type FET device and of the gate 56 of the second type FET device usually have their own internal structures, typically in layers. The gates, also referred to as gate stacks, 55, 56 of the two types of devices may be processed independently of one another, and they typically have differing structures.

The first type FET device has a first gate insulator 10 and the second type FET device has a second gate insulator 11. Both gate insulators comprise a high-k dielectrics. Such high-k dielectrics may be $ZrO_2$, $HfO_2$, $Al_2O_3$, HfSiO, HfSiON, and/or their admixtures. As known in the art, their common property is the possession of a larger dielectric constant than that of the standard oxide ($SiO_2$) gate insulator material, which has a value of approximately 3.9. In embodiments of the present invention the gate insulator of the first type FET device 10 and the gate insulator of the second type FET device 11 may comprise the same high-k material, or they may have differing high-k materials. In a typical embodiment of the invention the common high-k material present in both gate insulators 10, 11 is $HfO_2$. Each gate insulator 10, 11 apart of the high-k dielectric may have other components as well. Typically in embodiments of the present invention a very thin, less than about 1 nm, chemically deposited oxide may be present between the high-k dielectric layer and the device body 50. However, any and all inner structure, or the lack of any structure beyond simply containing a high-k dielectric, for either the first or second gate insulators 10, 11 is within the scope of the embodiments of the present invention. In exemplary embodiments of the present invention $HfO_2$ covering a thin chemical $SiO_2$ would be used as gate insulator, with an equivalent oxide thickness of about between 0.6 nm and 1.2 nm.

The second type FET device has a second liner 21. Liners are known in the art, and regularly used in standard CMOS processing. The material of such liners is an oxide, typically silicon-dioxide ($SiO_2$). The traditional role for the liners is in the protection of the gate during various processing steps, particularly during etching steps. Such liners typically have selective etching properties relative to nitride and silicon. The material of the second liner 21, typically $SiO_2$, allows oxygen to diffuse through it, and allows oxygen to reach the gate dielectric. Although a large surface region of the liner is covered by the spacer 60, which spacer blocks oxygen, at the edges of the liner 21, underneath the spacers, and next to the top of the gate, oxygen may enter the liner 21, reach the gate insulator 11, and shift the threshold voltage of the second type FET by a desired, predetermined amount.

It is understood that, as all figures, FIG. 1 is only a schematic representation. As known in the art, there may be many more elements in the structures than present in the figures, but these would not effect the scope of the embodiments of the present invention. Such an element, as an example, may be any further layers between a liner and a gate. One type of such often used layer is called offset, or source/drain, spacer, which serve in source/drain fabrication.

The first type FET device has a first liner 22. The first liner 22 may by much thinner than the second liner 21. The thickness range of the first liner 22 is in the range of about between 0.2 nm and 1.2 nm, typically being between about 0.4 nm and 0.8 nm. The first liner is also composed of oxide ($SiO_2$). Since the first liner is composed of oxide, oxygen may be capable to penetrate into it. However, the first liner 22 has a thickness significantly smaller than that of the second liner 21, which second liner is typically over 3 nm thick. Accordingly, although given enough time oxygen may pass through the first liner 22, it would do so in smaller quantities than are passing through the thicker second liner 21. The times involved in the technique of threshold shifting by oxygen exposure may usually be not more than a few hours. In the fabrication, in the time while sufficient amount of oxygen crosses the second liner 21 and reaches the second gate insulator 11 to affect the desired threshold shift for the second type FET, essentially no oxygen is crossing the first liner 22, and threshold of the first type FET stays unchanged. Such an outcome is the desired effect sought by embodiments of the present invention.

The first liner 22 typically is a, so called, chemical oxide, referring to the manner in which it was produced. Such chemical oxide depositions are known in the art. It is possible, that at its smallest thickness ranges the first liner 22 to some degree is discontinuous. In general, for the embodiments of the present invention the thickness of the first liner is selected in such a range as to be thick enough to fill its role of protecting the gate during etching steps, which etching steps mainly occur during spacer fabrication; meanwhile, the first liner 22 has to be thin compared to the second liner 21, such that it is capable to substantially prevent oxygen penetration. The technique of chemically depositing the first liner 22 is selected because this technique is able to produce in a controlled manner very thin uniform layers of oxide.

Further discussion and figures may present only those processing steps which are relevant to yield the structure of FIG. 1. Manufacturing of NFET, PFET, and CMOS is very well established in the art. It is understood that there are a large number of steps involved in such processing, and each step might have practically endless variations known to those skilled in the art. It is further understood that the whole range of known processing techniques are available for fabricating the disclosed device structures, and only those process steps will be detailed that are related to embodiments of the present invention.

Figure 2:
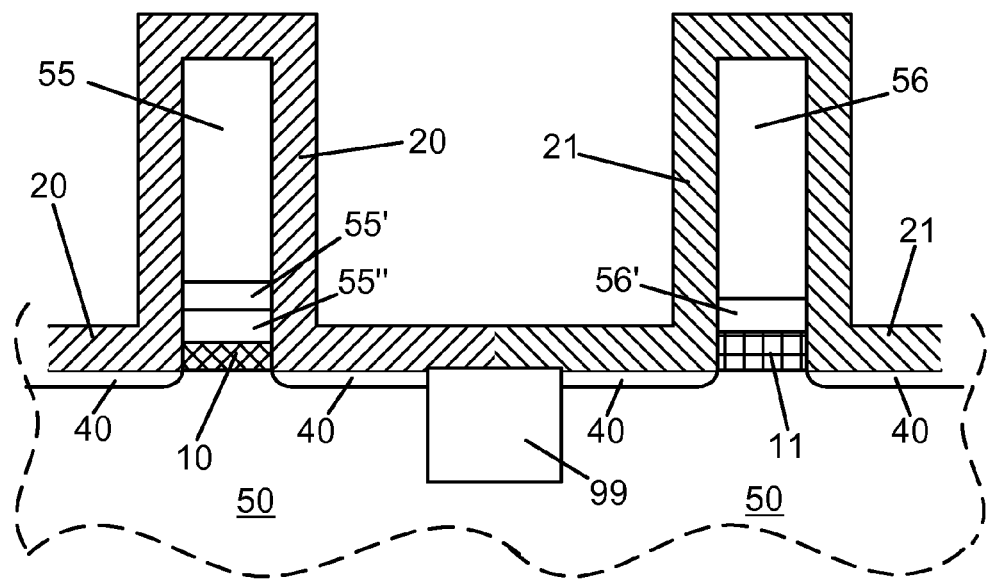
FIG. 2 shows a schematic cross section of an initial stage in the processing of the CMOS structure in accordance to an embodiment of the present invention.

FIG. 2 shows a schematic cross section of an initial stage in the processing of a CMOS structure according to an embodiment of the present invention. In a first type FET device a first gate insulator 10 has been implemented in a manner that this first gate insulator includes a first high-k dielectric. The first gate insulator 10, may essentially be of a high-k dielectric in itself, or may be implemented in combination with further dielectrics, such as, for instance, silicon dioxide, or others. A temporary liner 20 has been deposited conformally essentially over all of the first type FET, in particular over the gate 55 and over the source/drain 40 regions. The name of this liner "temporary" reflects the fact that in later processing steps it will be removed, to be replaces by the first liner 22. The temporary liner 20 consists essentially of an oxide material, typically $SiO_2$. This temporary liner 20 is similar to the second liner 21 of the second type FET and it is protecting the gate during various processing steps usually involved with source/drain fabrications. The temporary liner 20 is of comparable thickness as the second liner 21, consequently it is not adapted to prevent oxygen penetration to the first gate insulator 10.

FIG. 2 also shows that in a second type FET device a second gate insulator 11 has been implemented in a manner that this second gate insulator includes a second high-k dielectric. The second gate insulator 11, may essentially be of a high-k dielectric in itself, or may be implemented in combination with further dielectrics, such as, for instance silicon dioxide, or others. The second liner 21 has been deposited conformally essentially over all of the second type FET device, in particular over the gate 56 and over the source/drain 40 regions. The second liner 21 consists essentially of an oxide material, typically $SiO_2$.

Many possible pathways of fabrication, all leading to a structure as in FIG. 2, are known in the art. Particular details given in the description herein are not intended to be interpreted in a limiting fashion. In representative embodiments of the invention the temporary liner 20 and second liner 21 are being deposited during a single processing event, and thus have essentially identical properties. These liners 20, 21 could also be deposited during differing steps in the fabrication, and they may not have identical characteristics, such as, for instance, thickness, or exact composition. Similar considerations hold for the high-k materials in the first and second gate insulators 10, 11. In representative embodiments of the invention they may be deposited during differing processing steps, and may, or may not, be of the same material. However, the gate insulators as well may be deposited in the same processing steps. In exemplary embodiments of the present invention the high-k materials in the first and second gate insulators 10, 11 are of a same material, such as, for instance of $HfO_2$.

The gate 55 of the first type FET device and the gate 56 of the second type FET device may be composite structures themselves. Since the threshold of the first type FET device is selected not to be adjusted during an oxygen exposure, the composition of the gate 55 of the first type FET device has to be properly selected in order for the threshold voltage of the first type FET device to end up with the desired value. For this reason the first type FET device gate 55, may include a carefully selected, so called cap layer 55". Such cap layers are known in art, presented for instance by V. Narayanan et al, IEEE VLSI Symposium p. 224, (2006). The cap layer 55" may contain lanthanum (La), which under proper treatment may yield the desired threshold value. In typical embodiments of the present invention the first type FET device gate 55 my also contain a metal 55', such as, for instance, W, Ta, or others known in the art. Similarly, the gate 56 of the second type FET device also may have internal structure, for instance a metal layer 56'. This metal layer 56' may be in direct contact with the second gate insulator 11. A metal for the second type FET device gate 56' may also be selected to be W, Ta, or other metals known to be suitable for gate fabrication. Typically metals deemed suitable for being parts of the gates may include Mo, Mn, TaN, TiN, WN, Ru, Cr, Ta, Nb, V, W, Mn, Re, and their combinations. The metal layers 55', 56' of the first and second type FET device gates 55, 56 may be fabricated of the same material. There may be further layers present in the as fabricated gate stacks, such as amorphous silicon (α-Si) and polysilicon layers. In subsequent figures the possible internal structures of the gates will not be indicated, but it is understood that if such structure was present at the stage of processing shown on FIG. 2, then that internal structure of the gates does not change, and it will be present all through further fabrication, and in the completed devices, as well. The figure also shows that by this stage usually the source/drain extensions 40 have also been processed.

Figure 3:
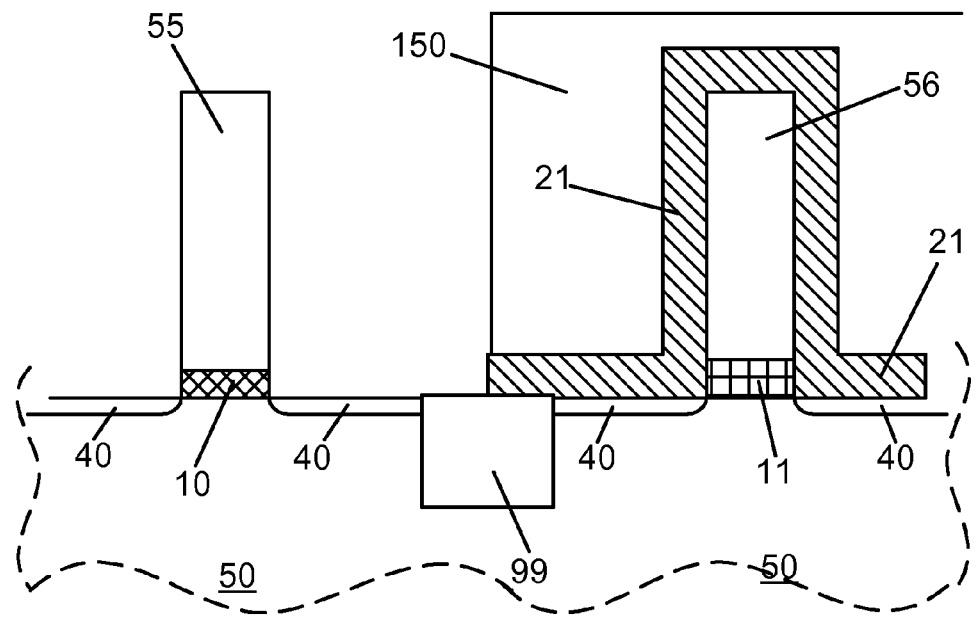
FIG. 3 shows a schematic cross section of a following stage in the processing of a CMOS structure according to an embodiment of the present invention.

FIG. 3 shows a schematic cross section of a following stage in the processing of a CMOS structure according to an embodiment of the present invention. The process is shown at a stage where the temporary liner 20 has been completely removed by etching in the first type FET. Etching steps, that usually involve masking and etching with diluted HF, which can remove an liner, such as the temporary liner 20, in a selective manner and leave other structures, such as the gate 55, intact, are known to those skilled in the art. While the regions of the first type FET are processed, a blocking mask 150, know to those skilled in the art, protects the regions of the second type FET.

Figure 4:
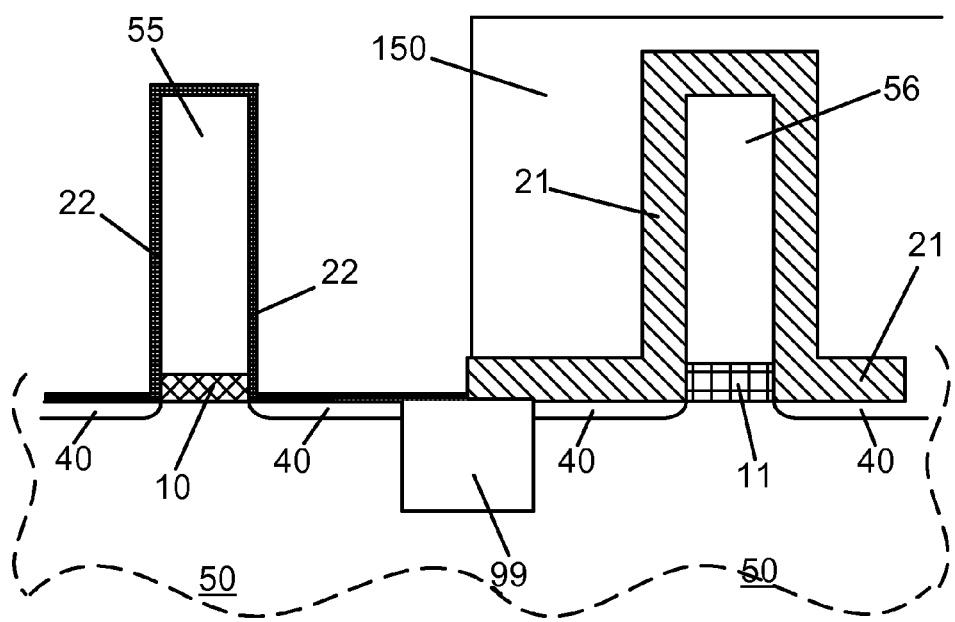
FIG. 4 shows a schematic cross section of a stage in the processing of a CMOS structure according to an embodiment of the present invention where the chemical oxide liner has been formed.

FIG. 4 shows a schematic cross section of a stage in the processing of a CMOS structure according to an embodiment of the present invention, where the chemical oxide liner has been deposited. The first type FET, including the gate 55 and the first gate insulator 10, have been covered by a conformally deposited oxide liner, the first liner 22. Forming oxide by chemical means is known in the art. Such a chemical forming is able to produce very thin uniform layers of oxide in a controlled manner. The thickness of the first liner 22 in representative embodiments of the present invention is selected to be between about 0.2 nm and 1.2 nm, with a preferred range being between about 0.4 nm and 0.8 nm. This oxide for the first liner 22, may be formed by using a conventional SC1 SC2 process, which is also known in the art as RCA clean.

Following the processing shown in FIG. 4, a series of standard steps known in the art may follow. Such steps may include fabricating and activating the sources and drains; forming silicide over sources/drains 41 and gates 42; processing the spacers 30, 60 for both devices. From the point of view of embodiments of the present invention the property of interest for the spacers 30, 60 is that they should not be penetrable by oxygen, since the spacers are to block oxygen entrance where they interface with the liners 21, 22. The usual material used for the spacers 30, 60 is nitride (SiN), which efficiently blocks oxygen. With these steps completed, one arrives to the desired structure depicted in FIG. 1, and discussed previously in reference to FIG. 1.

Figure 5:
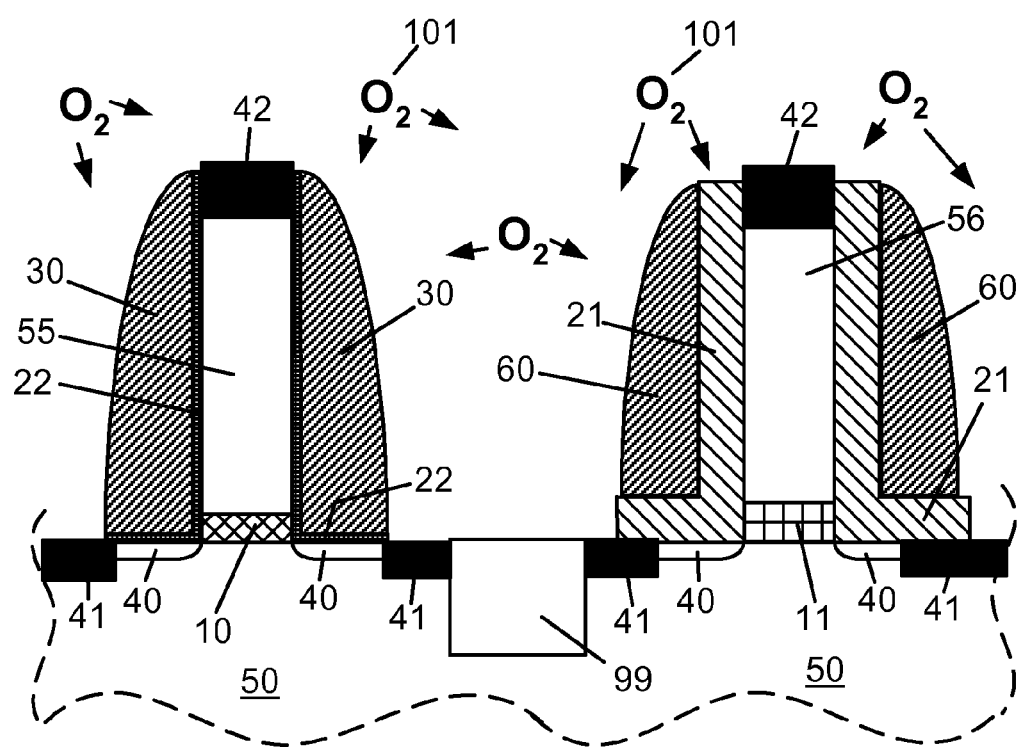
FIG. 5 shows a schematic cross section of a stage in the processing of a CMOS structure according to an embodiment of the present invention where oxygen exposure shifts the threshold of one type of device.
Figure 6:
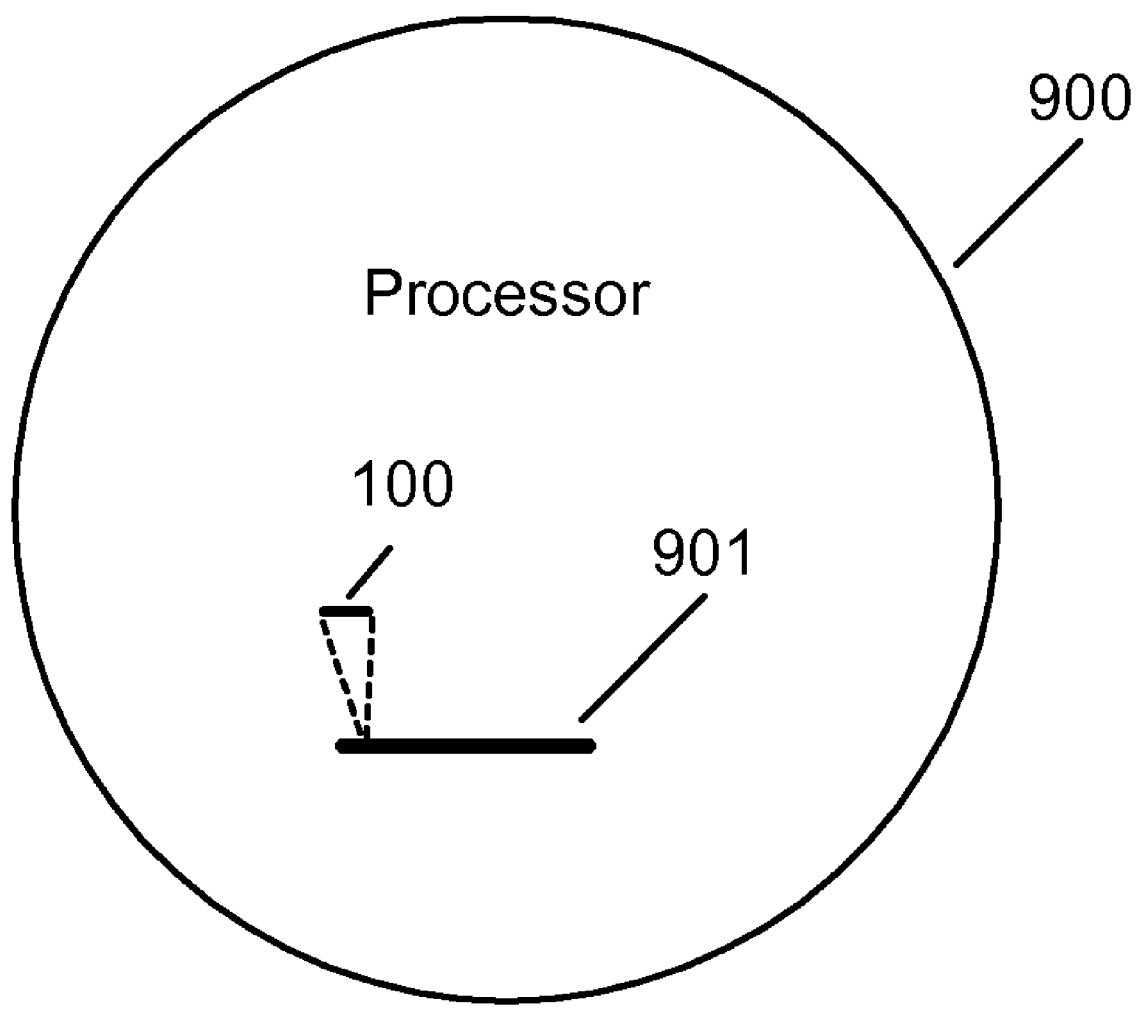
FIG. 6 shows a symbolic view of a processor containing at least one CMOS circuit according to an embodiment of the present invention.

FIG. 5 shows a schematic cross section of a stage in the processing of a CMOS structure according to an embodiment of the present invention, where oxygen exposure shifts the threshold of one type of device. The oxygen exposure 101 may occur at low temperature at about 200° C. to 350° C. by furnace or rapid thermal anneal. The duration of the oxygen exposure 101 may vary broadly from approximately 2 minutes to about 150 minutes. For the duration of the exposure oxygen is substantially blocked by the extreme thinness of the first liner 22 from penetrating to the first gate insulator 10, but oxygen is capable of penetrating to the second gate insulator 11. The amount of threshold shift depends on the oxygen exposure parameters, primarily on the temperature and duration of the procedure. Threshold shifts up to the range of 250 mV to 300 mV may be achieved in embodiments of the present invention.

The oxygen exposure does not have to affect all second type FET devices for a given chip, or processor. One may use global nitride masking to shield oxygen penetration for a portion of second type FET devices. In this manner one may fabricate chips, and processors, with second type FET devices of at least two different threshold values. Furthermore, the one does not necessarily have to implement the chemical oxide liner 22 as liners of all of the first type of FET devices on a given chip, or processor. Accordingly, on a given chip or processor and one may have at least two different threshold values for the first type of FET devices, as well. The threshold values may differ up to about 250 mV-300 mV, but often threshold differences of about 50 mV-100 mV are already of great value for some circuits. Examples of circuits that may find multiple threshold devices useful include circuits in signal processing and communication processors, and others.

After the oxygen exposure step, the CMOS structure, and its wiring into circuits may be completed with standard steps known to one skilled in the art.

FIG. 7 shows a symbolic view of a processor containing at least one CMOS structure incorporating an embodiment of the present invention. Such a processor 900 has at least one chip 901, which contains at least one CMOS structure 100, with a FET having high-k gate dielectric, a gate comprising a metal, and a liner composed of oxide having a thickness between about 0.2 nm and 1.2 nm. The processor 900 may be any processor which can benefit from embodiments of the present invention. Representative embodiments of processors manufactured with embodiments of the disclosed structure are digital processors, typically found in the central processing complex of computers; mixed digital/analog processors, typically found in signal processing and communication equipment; and others.

Many modifications and variations of the present invention are possible in light of the above teachings, and could be apparent for those skilled in the art. The scope of the invention is defined by the appended claims.

We claim:

1. A method for processing a CMOS structure, comprising:
   in a first type Field Effect Transistor (FET) device, implementing a first gate insulator comprising a first high-k dielectric, and fabricating a temporary liner;
   in said first type FET device, removing completely said temporary liner by etching;
   in said first type FET device, depositing a chemical oxide liner in place of said temporary liner with a first thickness of between about 0.2 nm and 1.2 nm;
   in a second type FET device, implementing a second gate insulator comprising a second high-k dielectric, and fabricating a second liner consisting essentially of oxide and having a second thickness, wherein said second thickness is selected to be at least three times larger than said first thickness; and
   exposing said first type FET device and said second type FET device to oxygen, wherein oxygen penetrates through said second liner reaching said second high-k dielectric of said second gate insulator, and causing a predetermined shift in the threshold voltage of said second type FET device, while due to said first thickness oxygen is substantially prevented from penetrating to said first high-k dielectric of said first gate insulator, whereby the threshold voltage of said first type FET device stays unchanged.

2. The method of claim 1, wherein said first type FET device is selected to be a PFET device, and said second type FET device is selected to be an NFET device.

3. The method of claim 1, wherein said first type FET device is selected to be an NFET device, and said second type FET device is selected to be a PFET device.

4. The method of claim 1, wherein said first high-k dielectric and said second high-k dielectric are selected to be of a same material.

5. The method of claim 4, wherein said same material is selected to be $HfO_2$.

6. The method of claim 1, further comprising:
   depositing a single layer of oxide over said first type FET device and said second type FET device, and fabricating said temporary liner and said second liner from said single layer of oxide.

7. The method of claim 1, further comprising:
   in said first type FET device, implementing a first gate comprising a first metal;
   in a second type FET device, implementing a second gate comprising a second metal.

8. The method of claim 7, wherein for said first gate, processing a cap layer to be sandwiched inbetween said first gate insulator and said first metal.

9. The method of claim 7, wherein for said second gate, processing said second metal in such manner to be in direct contact with said second insulator.

* * * * *